(12) United States Patent
Noguchi et al.

(10) Patent No.: US 11,456,393 B2
(45) Date of Patent: Sep. 27, 2022

(54) OPTICAL MODULE

(71) Applicant: CIG Photonics Japan Limited, Kanagawa (JP)

(72) Inventors: Daisuke Noguchi, Tachikawa (JP); Hiroshi Yamamoto, Inagi (JP)

(73) Assignee: CIG PHOTONICS JAPAN LIMITED, Sagamihara (JP)

(*) Notice: Subject to any disclaimer, the term of this patent is extended or adjusted under 35 U.S.C. 154(b) by 183 days.

(21) Appl. No.: 17/113,390

(22) Filed: Dec. 7, 2020

(65) Prior Publication Data
US 2021/0184056 A1 Jun. 17, 2021

(30) Foreign Application Priority Data
Dec. 17, 2019 (JP) .............................. JP2019-227627

(51) Int. Cl.
*H04B 10/00* (2013.01)
*H01L 31/024* (2014.01)
*H01L 31/02* (2006.01)

(52) U.S. Cl.
CPC ...... *H01L 31/024* (2013.01); *H01L 31/02005* (2013.01)

(58) Field of Classification Search
CPC combination set(s) only.
See application file for complete search history.

(56) References Cited

U.S. PATENT DOCUMENTS

| | | | | |
|---|---|---|---|---|
| 4,768,070 A * | 8/1988 | Takizawa | ............ | H01S 5/02326 372/75 |
| 5,068,866 A * | 11/1991 | Wada | ...................... | H01L 24/97 372/49.01 |
| 5,089,861 A * | 2/1992 | Tanaka | .................. | H01S 5/0231 257/680 |
| 5,550,675 A * | 8/1996 | Komatsu | ............. | H01L 31/0203 257/E31.118 |
| 5,557,116 A * | 9/1996 | Masui | ................... | H01S 5/0231 257/690 |
| 6,562,693 B2 * | 5/2003 | Ichikawa | ................ | H01L 24/85 257/82 |
| 6,567,439 B1 * | 5/2003 | Auracher | ............ | H01S 5/02253 372/36 |

(Continued)

FOREIGN PATENT DOCUMENTS

JP 2011-108939 A 6/2011

*Primary Examiner* — Agustin Bello
(74) *Attorney, Agent, or Firm* — Mattingly & Malur, PC

(57) ABSTRACT

An optical module includes: a thermoelectric cooler with an upper surface and a lower surface, the lower surface fixed to the first surface of the conductive block, the thermoelectric cooler having a Peltier device therein configured to transfer heat between the upper surface and the lower surface; a metal layer laminated on the upper surface of the thermoelectric cooler; a ground wire connecting the first surface of the conductive block and the metal layer; a photoelectric device adapted to convert an optical signal and an electrical signal at least from one to another; a mounting substrate on which the photoelectric device is mounted, the mounting substrate fixed to the upper surface of the thermoelectric cooler with at least the metal layer interposed therebetween, the mounting substrate having a first wiring pattern electrically connected to the photoelectric device.

13 Claims, 8 Drawing Sheets

(56) References Cited

U.S. PATENT DOCUMENTS

| | | | | |
|---|---|---|---|---|
| 6,807,207 B2* | 10/2004 | Shiomoto | H01S 5/4043 | 372/36 |
| 6,868,104 B2* | 3/2005 | Stewart | H01S 5/02212 | 372/36 |
| 6,876,685 B2* | 4/2005 | Umemoto | H01S 5/02257 | 372/36 |
| D505,664 S * | 5/2005 | Takagi | D13/182 | |
| 6,920,161 B2* | 7/2005 | Riaziat | H01S 5/0683 | 372/36 |
| 6,920,162 B2* | 7/2005 | Harding | H01L 33/647 | 372/109 |
| 7,037,001 B2* | 5/2006 | Oomori | H01S 5/02212 | 372/31 |
| 7,046,707 B2* | 5/2006 | Koizumi | H01S 5/0233 | 372/36 |
| 7,061,949 B1* | 6/2006 | Zhou | H01S 5/02257 | 372/36 |
| 7,154,126 B2* | 12/2006 | Aruga | G02B 6/4279 | 257/432 |
| 7,263,112 B2* | 8/2007 | Oomori | H01S 5/02212 | 372/36 |
| 7,358,542 B2* | 4/2008 | Radkov | C09K 11/778 | 257/E33.061 |
| 7,366,215 B2* | 4/2008 | Aruga | H01S 5/02345 | 372/38.1 |
| 7,463,659 B2* | 12/2008 | Go | H01S 5/02212 | 372/36 |
| 7,837,398 B2* | 11/2010 | Sato | H01S 5/02253 | 385/92 |
| 7,856,038 B2* | 12/2010 | Oomori | H01S 5/023 | 372/36 |
| 7,991,029 B2* | 8/2011 | Aruga | H05K 1/0243 | 372/29.013 |
| 8,509,575 B2* | 8/2013 | Okada | H01S 5/02345 | 372/36 |
| 8,743,564 B2* | 6/2014 | Kuwahara | H01L 31/0203 | 257/432 |
| 8,908,728 B1* | 12/2014 | Huikai | H01S 5/02415 | 372/36 |
| 9,059,569 B2* | 6/2015 | Yamanaka | H01L 33/486 | |
| 9,209,903 B2* | 12/2015 | Lee | H01S 5/02415 | |
| 9,372,315 B2* | 6/2016 | Miao | G02B 6/421 | |
| 9,541,714 B2* | 1/2017 | Lim | H04B 10/40 | |
| 9,625,671 B2* | 4/2017 | Vorndran | G02B 27/30 | |
| 9,628,184 B2* | 4/2017 | Pfnuer | G02B 6/4251 | |
| 9,859,680 B2* | 1/2018 | Serbicki | H01S 5/02212 | |
| 9,980,379 B2* | 5/2018 | Noguchi | H05K 1/025 | |
| 10,168,493 B2* | 1/2019 | Shirasaki | G02B 6/4266 | |
| 10,211,599 B2* | 2/2019 | Vorndran | H01S 5/0071 | |
| 10,334,717 B2* | 6/2019 | Noguchi | H05K 1/025 | |
| 10,431,955 B2* | 10/2019 | Serbicki | H01S 5/3402 | |
| 10,763,638 B2* | 9/2020 | Jungwirth | H01S 5/12 | |
| 10,771,155 B2* | 9/2020 | McLaurin | G02B 27/0916 | |
| 10,819,084 B2* | 10/2020 | Zhang | H01S 5/02212 | |
| 10,852,493 B2* | 12/2020 | Noguchi | G02B 6/4244 | |
| 11,153,962 B2* | 10/2021 | Kimura | H05K 7/1427 | |
| 11,206,087 B2* | 12/2021 | Otani | G02F 1/017 | |
| 11,256,048 B2* | 2/2022 | Hettler | G02B 6/12033 | |
| 11,385,422 B2* | 7/2022 | Saeki | G02B 6/4279 | |
| 2001/0006235 A1* | 7/2001 | Ozawa | H01L 33/40 | 257/712 |
| 2003/0043868 A1* | 3/2003 | Stewart | H01S 5/02212 | 372/36 |
| 2003/0086243 A1* | 5/2003 | Harding | H01L 33/647 | 361/700 |
| 2003/0183921 A1* | 10/2003 | Komobuchi | B81B 7/0077 | 257/E31.117 |
| 2003/0214860 A1* | 11/2003 | Greenlaw | H05K 1/0253 | 365/200 |
| 2003/0218923 A1* | 11/2003 | Giaretta | H01S 5/02212 | 365/200 |
| 2004/0074661 A1* | 4/2004 | Schiaffino | H01S 5/02212 | 257/E23.19 |
| 2004/0081410 A1* | 4/2004 | Aronson | H01S 5/02212 | 257/E23.19 |
| 2004/0126066 A1* | 7/2004 | Keh | G02B 6/4279 | 385/92 |
| 2004/0129441 A1* | 7/2004 | Giaretta | H01S 5/02212 | 174/548 |
| 2004/0151505 A1* | 8/2004 | Aronson | H01S 5/02212 | 257/E23.19 |
| 2004/0163836 A1* | 8/2004 | Kumar | H01S 5/02212 | 257/E23.19 |
| 2004/0240497 A1* | 12/2004 | Oomori | H01S 5/02212 | 372/36 |
| 2004/0247004 A1* | 12/2004 | Keh | H01S 5/0683 | 372/36 |
| 2004/0247259 A1* | 12/2004 | Blom | G02B 6/4292 | 257/E31.117 |
| 2005/0008049 A1* | 1/2005 | Oomori | H01S 5/02325 | 372/36 |
| 2005/0013561 A1* | 1/2005 | Kuhara | G02B 6/4243 | 385/92 |
| 2005/0047460 A1* | 3/2005 | Go | H01S 5/02212 | 372/36 |
| 2005/0047731 A1* | 3/2005 | Hu | G01B 11/272 | 385/92 |
| 2005/0067698 A1* | 3/2005 | Aruga | H01S 5/0427 | 257/737 |
| 2005/0105911 A1* | 5/2005 | Keh | H01S 5/02212 | 398/138 |
| 2005/0121684 A1* | 6/2005 | Aruga | G02B 6/4292 | 257/98 |
| 2005/0130342 A1* | 6/2005 | Zheng | H01L 31/0203 | 257/E31.118 |
| 2005/0141825 A1* | 6/2005 | Lee | H01L 31/02005 | 385/92 |
| 2005/0175299 A1* | 8/2005 | Hargis | G02B 6/4292 | 385/92 |
| 2005/0185882 A1* | 8/2005 | Zack | G02B 6/4256 | 385/15 |
| 2005/0196112 A1* | 9/2005 | Takagi | H01L 24/78 | 385/94 |
| 2005/0201433 A1* | 9/2005 | Riaziat | H01S 5/0683 | 372/36 |
| 2005/0207458 A1* | 9/2005 | Zheng | H01S 5/02415 | 372/34 |
| 2005/0207459 A1* | 9/2005 | Yu | H01L 31/0203 | 257/E31.118 |
| 2006/0007516 A1* | 1/2006 | Kagaya | G02F 1/0121 | 359/245 |
| 2006/0072883 A1* | 4/2006 | Kilian | G02B 6/4204 | 385/33 |
| 2006/0176918 A1* | 8/2006 | Aruga | H01S 5/02345 | 372/38.1 |
| 2007/0120134 A1* | 5/2007 | Oshima | H01S 5/02345 | 257/82 |
| 2007/0159773 A1* | 7/2007 | Deng | H01S 5/026 | 361/600 |
| 2007/0201881 A1* | 8/2007 | Douma | G02B 6/4246 | 257/E31.118 |
| 2007/0237196 A1* | 10/2007 | Oomori | H01S 5/0235 | 372/36 |
| 2009/0135864 A1* | 5/2009 | Aruga | H05K 1/0243 | 372/29.02 |
| 2009/0269067 A1* | 10/2009 | Kihara | H04J 14/02 | 398/79 |
| 2010/0008093 A1* | 1/2010 | Lin | H01L 31/0203 | 362/365 |
| 2010/0213471 A1* | 8/2010 | Fukasawa | H01L 24/37 | 257/E33.056 |
| 2010/0290488 A1* | 11/2010 | Ko | H01S 3/109 | 372/22 |
| 2011/0085767 A1* | 4/2011 | Miao | G02B 6/4267 | 385/88 |
| 2012/0045161 A1* | 2/2012 | Okada | H01S 5/02345 | 385/1 |
| 2014/0037293 A1* | 2/2014 | Lee | H01S 5/02453 | 398/79 |

(56) References Cited

U.S. PATENT DOCUMENTS

| | | | | |
|---|---|---|---|---|
| 2014/0112363 | A1* | 4/2014 | Feitisch | H01S 5/02355 438/26 |
| 2015/0008552 | A1* | 1/2015 | Matsusue | H01L 31/12 257/431 |
| 2015/0043166 | A1* | 2/2015 | Heo | H04B 10/503 29/612 |
| 2015/0104199 | A1* | 4/2015 | Ye | H04B 10/40 359/288 |
| 2015/0116809 | A1* | 4/2015 | Uto | H01S 5/02208 359/245 |
| 2015/0125162 | A1* | 5/2015 | Pfnuer | G02B 6/4251 398/201 |
| 2015/0155944 | A1* | 6/2015 | Lee | H01S 5/02345 372/50.1 |
| 2015/0200730 | A1* | 7/2015 | Kim | H01S 5/0687 372/20 |
| 2015/0241636 | A1* | 8/2015 | Ohata | G02B 6/4267 359/820 |
| 2016/0036192 | A1* | 2/2016 | Serbicki | H01S 5/02212 29/879 |
| 2016/0112776 | A1* | 4/2016 | Kim | G09G 3/3648 398/48 |
| 2016/0126382 | A1* | 5/2016 | Yang | H01L 25/167 327/109 |
| 2016/0276802 | A1* | 9/2016 | Gao | H01S 5/042 |
| 2016/0327365 | A1* | 11/2016 | Collin | G01K 17/003 |
| 2017/0051884 | A1* | 2/2017 | Raring | H01S 5/02469 |
| 2017/0063464 | A1* | 3/2017 | Ho | G02B 6/3831 |
| 2017/0064831 | A1* | 3/2017 | Noguchi | H05K 1/025 |
| 2017/0085970 | A1* | 3/2017 | Zhang | H04Q 11/0005 |
| 2017/0133821 | A1* | 5/2017 | Kimura | H01S 5/02469 |
| 2018/0003908 | A1* | 1/2018 | Jung | G02B 6/4245 |
| 2018/0310397 | A1* | 10/2018 | Noguchi | H05K 1/141 |
| 2019/0074658 | A1* | 3/2019 | Jungwirth | H01S 5/12 |
| 2020/0064572 | A1* | 2/2020 | Hettler | H01S 5/02212 |
| 2020/0192038 | A1* | 6/2020 | Noguchi | G02B 6/4248 |
| 2020/0203922 | A1* | 6/2020 | Zhang | H01S 5/022 |
| 2020/0220322 | A1* | 7/2020 | Takagi | H01S 5/0231 |
| 2020/0337147 | A1* | 10/2020 | Kimura | H05K 7/1427 |
| 2021/0076500 | A1* | 3/2021 | Noguchi | H05K 1/14 |
| 2021/0132305 | A1* | 5/2021 | Noguchi | G02B 6/428 |
| 2021/0165177 | A1* | 6/2021 | Chang | G02B 6/4257 |
| 2021/0184056 | A1* | 6/2021 | Noguchi | H01L 31/024 |
| 2021/0218473 | A1* | 7/2021 | Otani | H01S 5/02345 |
| 2021/0271038 | A1* | 9/2021 | Noguchi | G02B 6/4274 |
| 2021/0281042 | A1* | 9/2021 | Krause | H01S 5/02415 |
| 2021/0333496 | A1* | 10/2021 | Chang | G02B 6/4271 |
| 2021/0336701 | A1* | 10/2021 | Noguchi | H05K 1/181 |
| 2021/0351563 | A1* | 11/2021 | Noguchi | H01S 5/02212 |
| 2022/0069540 | A1* | 3/2022 | Wai Li | H01S 5/02212 |
| 2022/0069543 | A1* | 3/2022 | Wai Li | H01S 5/02212 |
| 2022/0069544 | A1* | 3/2022 | Wai Li | H01L 23/10 |
| 2022/0103262 | A1* | 3/2022 | Noguchi | H01L 24/05 |
| 2022/0173571 | A1* | 6/2022 | Noguchi | H01S 5/02345 |
| 2022/0201863 | A1* | 6/2022 | Noguchi | H05K 1/181 |

\* cited by examiner

OPTICAL MODULE

CROSS-REFERENCE TO RELATED APPLICATION

The present application claims priority from Japanese patent application JP2019-227627 filed on Dec. 17, 2019, the contents of which are hereby incorporated by reference into this application.

BACKGROUND

1. Field

This relates to an optical module.

2. Description of the Related Art

A TO-CAN (Transistor Outline Can) Type package, using lead pins held by a dielectric such as glass in through holes of an eyelet, is configured to transmit electrical signals to an optical semiconductor device. The lead pins and electronic components contained in the package are connected by wires, and the lead pins protrude approximately 0.6 mm or more to prevent interference between a wire-bonding tool and the electronic components. The electronic components include a thermoelectric cooler using a Peltier device (JP2011-108939A). There is a bonding portion of the wire, above a heat-absorbing surface of the thermoelectric cooler. The heat-absorbing surface of the thermoelectric cooler has an unstable potential because it is made of an insulator, and the confinement effect of the electromagnetic field is weak. Therefore, the protruding lead pins become an antenna element, and the high-frequency signal excites the lead pins, resulting in signal transmission loss. In recent years, there has been an increasing demand for modules having high transmission rates. Therefore, stabilization of the ground potential has become important.

SUMMARY

This aims at reducing signal transmission loss.

(1) An optical module includes: a conductive block with a first surface and a second surface, the conductive block having some through holes extending therethrough between the first surface and the second surface; some lead pins including a signal lead pin, the lead pins fixed inside the respective through holes and insulated from the conductive block; a thermoelectric cooler with an upper surface and a lower surface, the lower surface fixed to the first surface of the conductive block, the thermoelectric cooler having a Peltier device therein configured to transfer heat between the upper surface and the lower surface; a metal layer laminated on the upper surface of the thermoelectric cooler; a ground wire connecting the first surface of the conductive block and the metal layer; a photoelectric device adapted to convert an optical signal and an electrical signal at least from one to another; a mounting substrate on which the photoelectric device is mounted, the mounting substrate fixed to the upper surface of the thermoelectric cooler with at least the metal layer interposed therebetween, the mounting substrate having a first wiring pattern electrically connected to the photoelectric device; a relay substrate having a second wiring pattern electrically connected to the signal lead pin; and a signal wire configured to connect the first wiring pattern and the second wiring pattern.

This can reduce the signal transmission loss, due to stabilized potential of the metal layer laminated on the upper surface of the thermoelectric cooler because it is connected to the conductive block with the ground wire.

(2) In the optical module according to (1), the mounting substrate may have a mounting surface on which the photoelectric device is mounted, and the upper surface of the thermoelectric cooler and the mounting surface may face in respective directions intersecting with each other.

(3) In the optical module according to (2), the photoelectric device may be arranged such that an optical axis extends in a direction parallel to the mounting surface.

(4) The optical module according to any one of (1) to (3), may further include a support block interposed between the metal layer and the mounting substrate.

(5) In the optical module according to (4), the support block may have a cuboid shape, the cuboid shape having a surface fixed to the metal layer and another surface fixed to the mounting substrate, which are adjacent to each other.

(6) In the optical module according to (4) or (5), the support block may be made of metal.

(7) In the optical module according to (4) or (5), the support block may be made of non-metal.

(8) In the optical module according to any one of (1) to (3), the metal layer may be part of a metal block interposed between the upper surface of the thermoelectric cooler and the mounting substrate, the metal block may have a projection integral with the metal layer, and the mounting substrate may be mounted on the projection.

(9) In the optical module according to any one of (1) to (8), the signal lead pin may be adapted to single-ended driving of the photoelectric device, and the first wiring pattern may have a ground electrode to which a back side of the photoelectric device is bonded.

(10) In the optical module according to any one of (1) to (8), the signal lead pin may be a pair of signal lead pins adapted to drive the photoelectric device by differential signals, the first wiring pattern may include a pair of first differential signal lines, and the second wiring pattern may include a pair of second differential signal lines bonded to the respective pair of signal lead pins.

(11) In the optical module according to any one of (1) to (10), the ground wire may be two or more ground wires.

(12) In the optical module according to any one of (1) to (11), the conductive block may have a pedestal portion integral with the first surface, and the relay board may rest on the pedestal portion.

(13) The optical module according to any one of (1) to (12), may further include a thermistor mounted on the metal layer.

DETAILED DESCRIPTION

Figure 1:
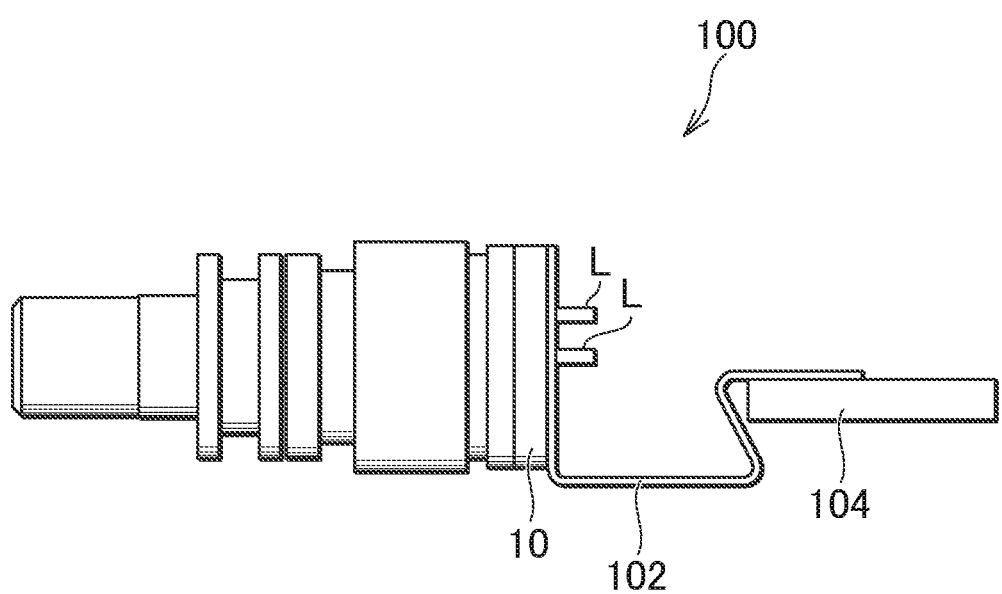
FIG. 1 is a perspective view of an optical module according to a first embodiment.

Hereinafter, with reference to drawings, the embodiment of the present invention is described specifically and in detail. In all the drawings, the same members are denoted by the same reference numerals and have the same or equivalent functions, and a repetitive description thereof will be omitted. The size of the figure does not necessarily coincide with the magnification.

First Embodiment

FIG. 1 is a perspective view of an optical module according to a first embodiment. The optical module 100 is a TO-CAN (Transistor Outline-Can) type optical module, and may be any of an optical transmission subassembly with a light emitting device (TOSA: Transmitter Optical Sub-Assembly), an optical reception subassembly with a light receiving device (ROSA: Receiver Optical Sub-Assembly), and a two-way module with both a light emitting device and a light receiving device (BOSA: Bidirectional Optical Sub-Assembly). The optical module 100 has a flexible printed circuit board (FPC) 102 and is configured to be connected to a printed circuit board (PCB) 104. The optical module 100 has a conductive block 10 (e.g., an eyelet).

Figure 2:
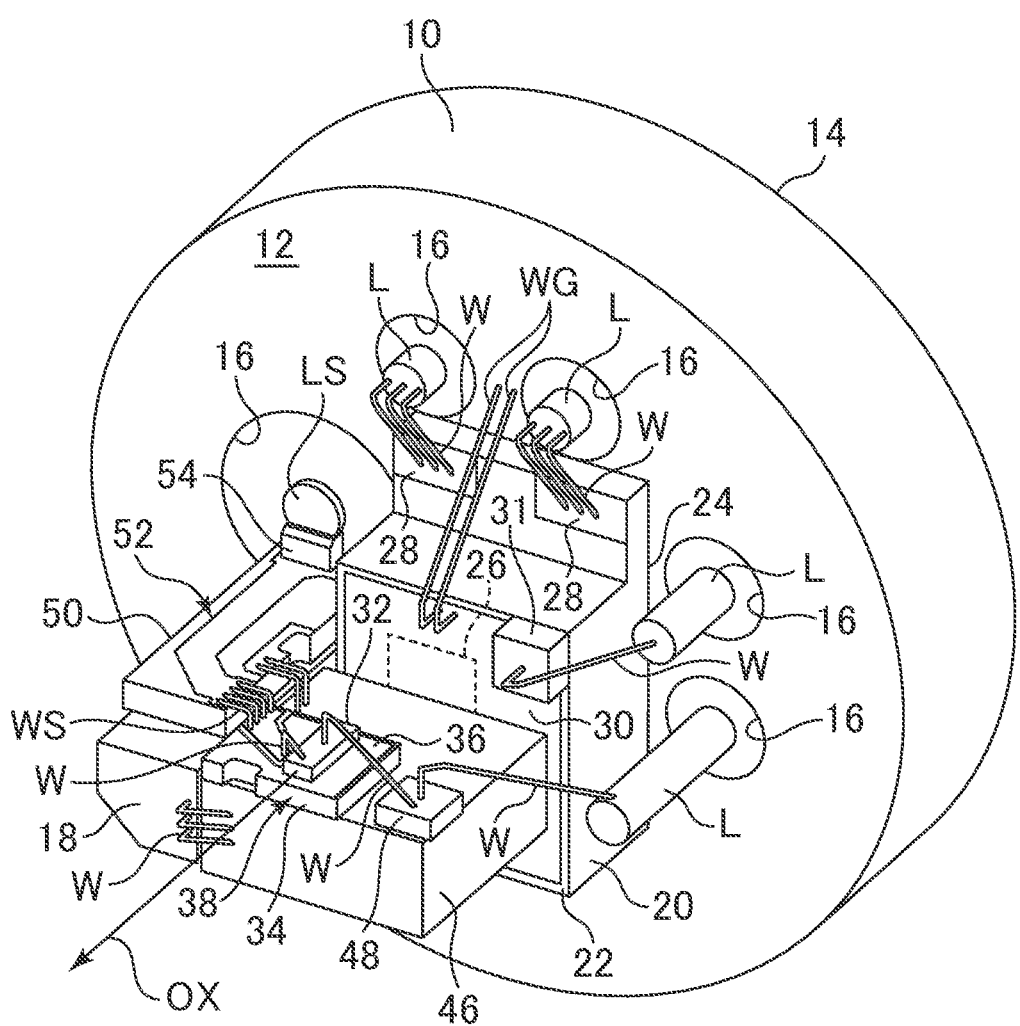
FIG. 2 is a perspective view of a conductive block and some electronic components mounted thereon.

FIG. 2 is a perspective view of a conductive block 10 and some electronic components mounted thereon. The conductive block 10 is made of a conductive material such as metal, and has a first surface 12 and second surface 14. The conductive block 10 has some through holes 16 penetrating between the first surface and the second surface 14. The conductive block 10 has a pedestal portion 18 integral with the first surface 12. The pedestal portion 18 is also made of a conductor. The conductive block 10 is connected to a reference potential (e.g., ground).

The optical module 100 has some lead pins L (including a signal lead pin LS). The lead pins L are fixed inside the respective through holes 16 and insulated from the conductive block 10. The lead pins L protrude from the first surface 12. The lead pins L also protrude from the second surface 14 and are connected to the flexible printed circuit board 102 (FIG. 1).

The optical module 100 includes a thermoelectric cooler 20. The thermoelectric cooler 20 has an upper surface 22 and a lower surface 24. The upper surface 22 and the lower surface 24 are made of an insulator such as ceramic. The lower surface 24 is fixed to the first surface 12 of the conductive block 10. A thermally conductive adhesive may be used for fixing. The thermoelectric cooler 20 has a Peltier device 26 therein for transferring heat between the top surface 22 and the lower surface 24. For example, the upper surface 22 is the heat-absorbing surface and the lower surface 24 is the heat-radiating surface, or vice versa by switching. An electrode 28 of thermoelectric cooler 20 is connected to the lead pin L with a wire W.

A metal layer 30 is laminated on the upper surface 22 of the thermoelectric cooler 20. The metal layer 30 serves as a reference potential plane (e.g., ground plane). Two or more ground wires WG connect the first surface 12 of the conductive block 10 and the metal layer 30. Thus, the potential of the metal layer 30 becomes the same as the conductive block 10 and stabilizes. A thermistor 31 rests on and is electrically connected to the metal layer 30 for measuring the temperature. The thermistor 31 is connected to a lead pin L with a wire W for applying a voltage thereto.

The optical module 100 has a photoelectric device 32 for converting an optical signal and an electrical signal at least from one to another. The photoelectric device 32 is fixed to the upper surface 22 of the thermoelectric cooler 20 at least through the metal layer 30. Since the ground potential of the metal layer 30 is stabilized, the signal transmission loss is reduced. The photoelectric device 32 is adapted to be single-ended driven.

The photoelectric device 32 is mounted on a mounting substrate 34. The mounting substrate 34 has a mounting surface on which the photoelectric device 32 is mounted. The photoelectric device 32 is arranged such that an optical axis OX extends in a direction parallel to the mounting surface 36. The upper surface 22 of the thermoelectric cooler 20 and the mounting surface 36 face in respective directions crossing each other (e.g., orthogonal). The mounting substrate 34 has a first wiring pattern 38 on the mounting surface 36.

Figure 3:
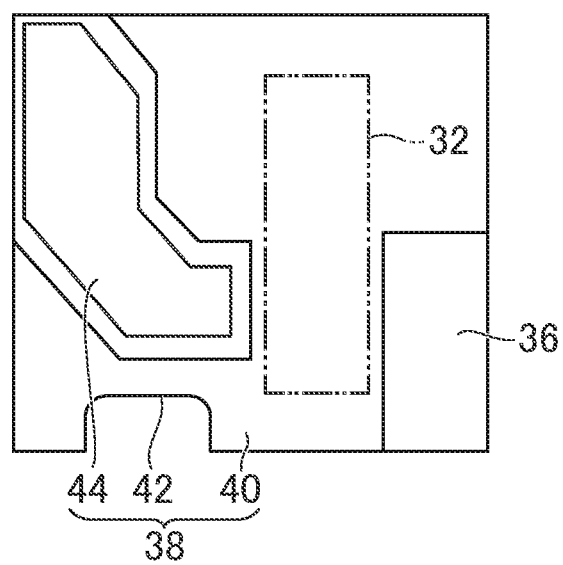
FIG. 3 is a plan view of a first wiring pattern.

FIG. 3 is a plan view of a first wiring pattern 38. The first wiring pattern 38 is electrically connected to the photoelectric device 32. Specifically, the first wiring pattern 38 has a ground electrode 40 to which a back side (electrode) of the photoelectric device 32 is bonded. The ground electrode 40 is integrated with the side electrode 42, enabling electrical connection on a side opposite to the mounting surface 36. The first wiring pattern 38 has a signal electrode 44 for inputting high-frequency signals to the photoelectric device 32. The signal electrode 44 and the photoelectric device 32 are connected to each other with a wire W.

As shown in FIG. 2, a support block 46 is interposed between the metal layer 30 and the mounting substrate 34. The support block 46 is made of a metal that is a conductive material. The support block 46 is conductive with the metal layer 30, and is conductive with the ground electrode 40 (FIG. 3) via the side electrode 42 of the mounting substrate 34. The support block 46 has a cuboid shape; the cuboid shape has a surface fixed to the metal layer 30 and another surface fixed to the mounting substrate 34, which are adjacent to each other; the angle between the surfaces is at a right angle. The support block 46 is connected to the pedestal portion 18 of the conductive block 10, with a wire W.

A bypass capacitor 48 is mounted on the support block 46. The back side (electrode) of the bypass capacitor 48 is conducted to the support block 46 and is connected to the reference potential (e.g., ground). The other electrode of the bypass capacitor 48, via a wire W, is connected to a lead pin L, so that a voltage is applied. The voltage, via another wire W, is also connected to the photoelectric device 32 for the power supply voltage to be supplied.

A relay board 50 is mounted on the pedestal portion 18 of the conductive block 10. The relay substrate 50 has a second wiring pattern 52. The second wiring pattern 52 is electrically connected to the signal lead pin LS. Specifically, between an end of the signal lead pin LS (protruding portion from the first surface 12) and a terminal of the second wiring pattern 52, a filler metal 54 (solder, brazing material) is interposed to electrically connect them. The second wiring pattern 52, via a signal wire WS, is connected to the first wiring pattern 38.

Second Embodiment

Figure 4:
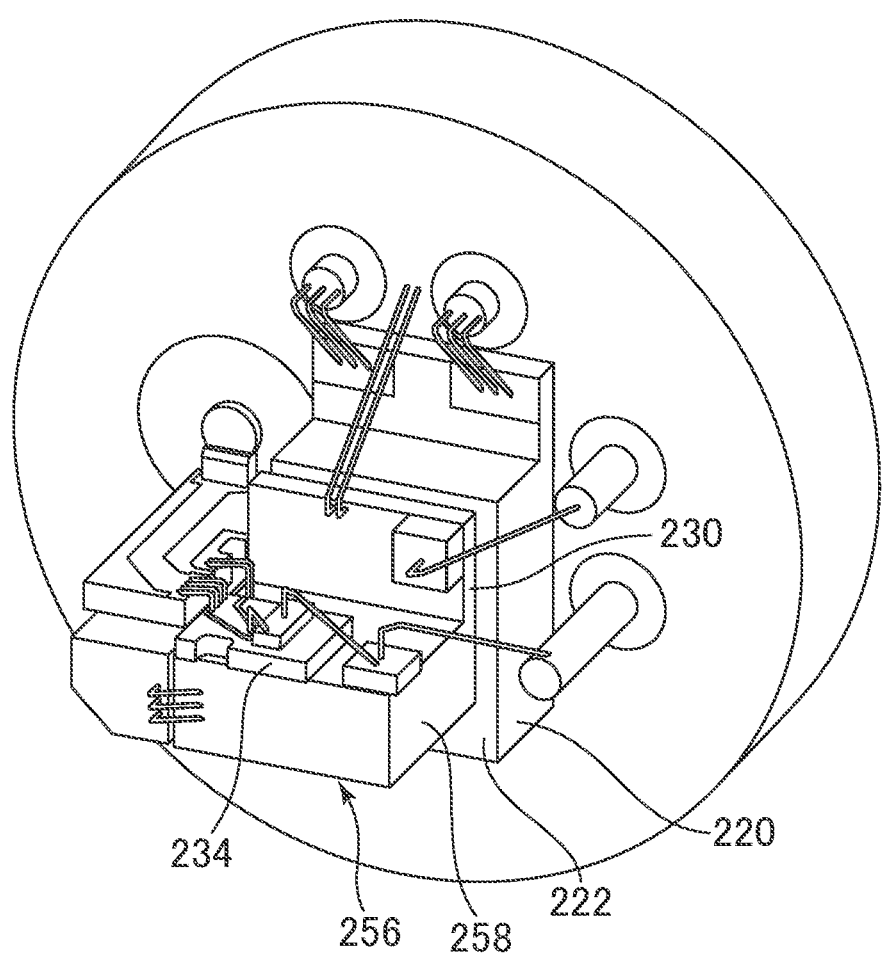
FIG. 4 is a perspective view of a conductive block and some electronic components mounted thereon in a second embodiment.

FIG. 4 is a perspective view of a conductive block and some electronic components mounted thereon in a second embodiment. In this embodiment, the metal layer 230 is part of the metal block 256. The metal block 256 is interposed between the top surface 222 of the thermoelectric cooler 220 and the mounting substrate 234. The metal block 256 has a protrusion 258 integral with the metal layer 230. The mounting substrate 234 is mounted on the projection 258. The contents described in the first embodiment are applicable to this embodiment.

Third Embodiment

Figure 5:
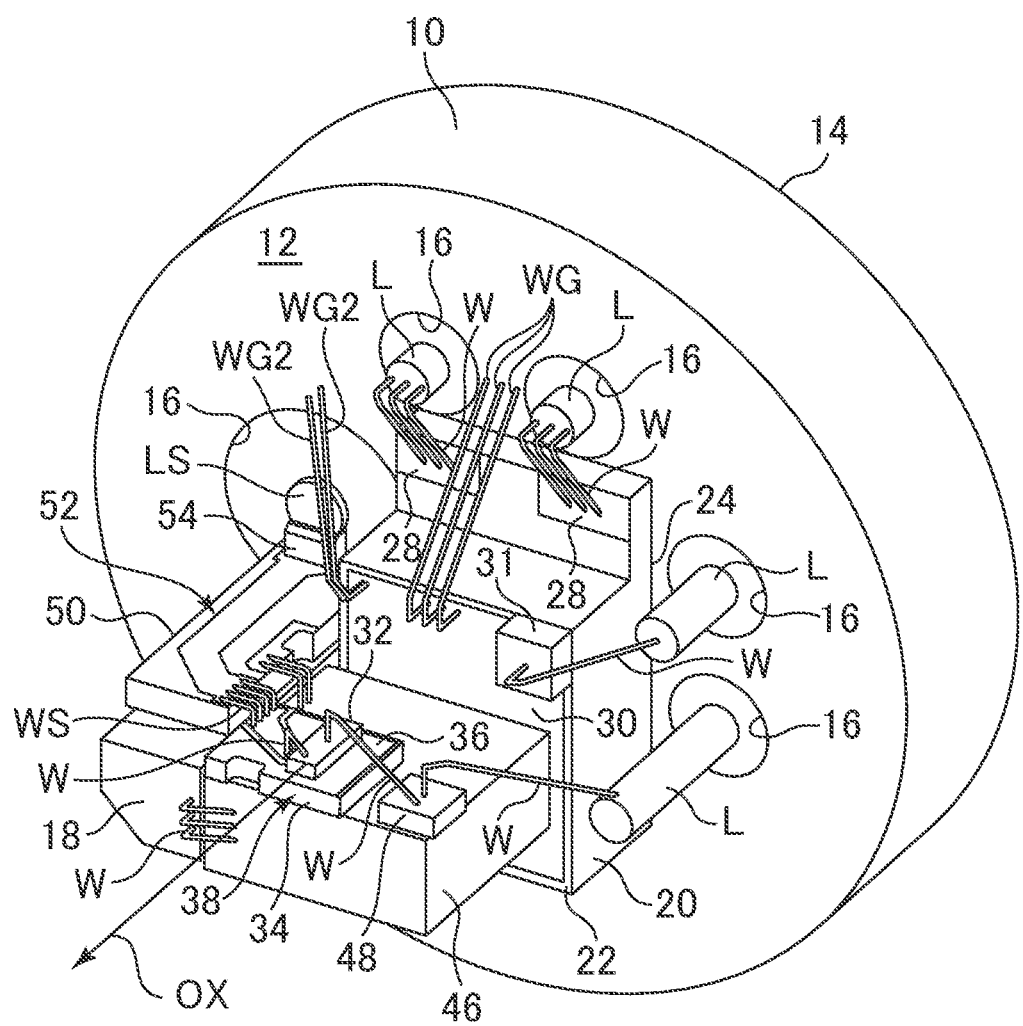
FIG. 5 is a perspective view of a conductive block and some electronic components mounted thereon in a third embodiment.

FIG. 5 is a perspective view of a conductive block 10 and some electronic components mounted thereon in a third embodiment. In the present embodiment, in addition to a group of ground wires WG described in the first embodiment, another group of ground wires WG2 are provided. Therefore, the potential of the metallic layer 30 is further stabilized by the many ground wires WG and WG2. The contents described in the first embodiment are applicable to this embodiment.

Figure 6:
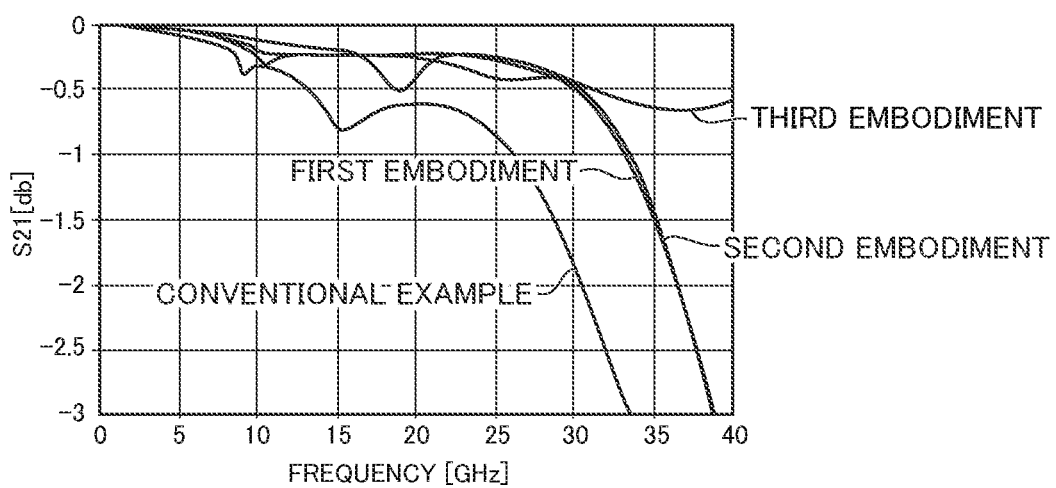
FIG. 6 is a diagram of frequency characteristics, in a conventional example and the first to third embodiments, obtained by simulation using a three-dimensional electric field analysis tool.

FIG. 6 is a diagram of frequency characteristics, in a conventional example and the first to third embodiments, obtained by simulation using a three-dimensional electric field analysis tool. As compared with the conventional example where no metal layer is provided on the upper surface of the thermoelectric cooler, the transmission characteristics (S21) of the first to third embodiments are apparently improved.

Fourth Embodiment

Figure 7:
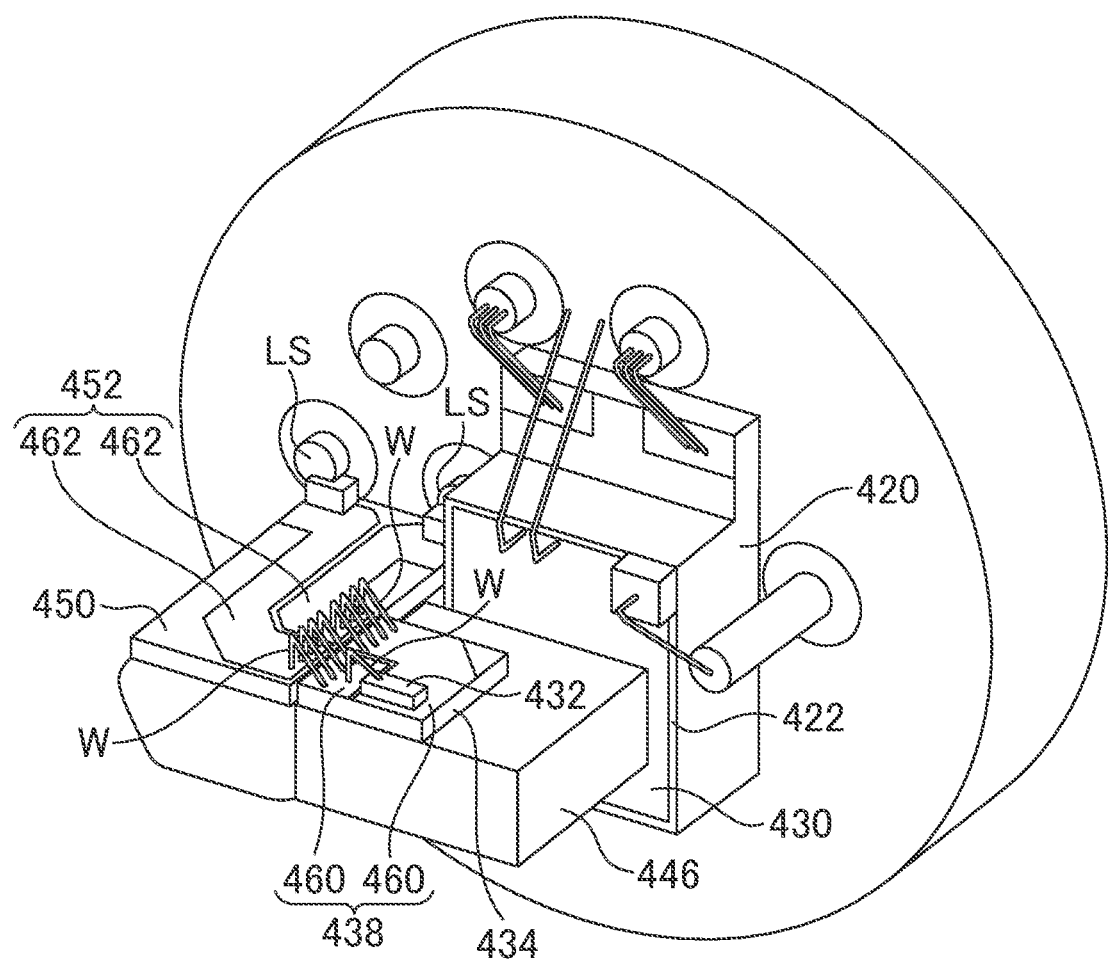
FIG. 7 is a perspective view of a conductive block and some electronic components mounted thereon in a fourth embodiment.

FIG. 7 is a perspective view of a conductive block and some electronic components mounted thereon in a fourth embodiment. In the present embodiment, the photoelectric device 432 is driven by differential signals. Correspondingly, the first wiring pattern 438 of the mounting substrate 434 includes a pair of first differential signal lines 460. A back electrode (not shown) of the photoelectric device 432 is electrically connected to one of the pair of first differential signal lines 460. The other of the pair of first differential signal lines 460 and the photoelectric device 432 are connected to each other, with a wire W.

The second wiring pattern 452 of the relay substrate 450 includes a pair of second differential signal lines 462. Each of the pair of second differential signal lines 462, with the wire W, is connected to a corresponding one of the pair of first differential signal lines 460. The pair of second differential signal lines 462 are bonded to a respective pair of signal lead pins LS. Thus, the pair of signal lead pins LS are electrically connected to the photoelectric device 432. Incidentally, the support block 446 is made of a non-metal such as ceramic (insulator). Therefore, the metal layer 430 and the mounting substrate 434 are electrically insulated. The contents described in the first embodiment are applicable to this embodiment.

Figure 8:
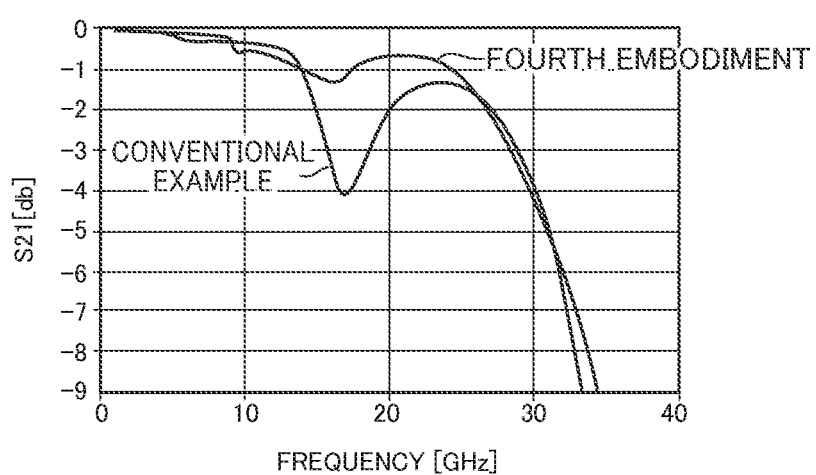
FIG. 8 is a diagram of frequency characteristics, in a conventional example and the fourth embodiment, obtained by simulation using the three-dimensional electric field analysis tool.

FIG. 8 is a diagram of frequency characteristics, in a conventional example and the fourth embodiment, obtained by simulation using the three-dimensional electric field analysis tool. In the conventional example, there is no metal layer on the top surface of the thermoelectric cooler, and the support block is made of metal. As compared with the conventional example, the transmission characteristics S21 of the fourth embodiment is apparently improved.

While there have been described what are at present considered to be certain embodiments, it will be understood that various modifications may be made thereto, and it is intended that the appended claims cover all such modifications as fall within the true spirit and scope of the invention.

What is claimed is:

1. An optical module comprising:
   a conductive block with a first surface and a second surface, the conductive block having some through holes extending therethrough between the first surface and the second surface;
   some lead pins including a signal lead pin, the lead pins fixed inside the respective through holes and insulated from the conductive block;
   a thermoelectric cooler with an upper surface and a lower surface, the lower surface fixed to the first surface of the conductive block, the thermoelectric cooler having a Peltier device therein configured to transfer heat between the upper surface and the lower surface;
   a metal layer laminated on the upper surface of the thermoelectric cooler;
   a ground wire connecting the first surface of the conductive block and the metal layer;
   a photoelectric device adapted to convert an optical signal and an electrical signal at least from one to another;
   a mounting substrate on which the photoelectric device is mounted, the mounting substrate fixed to the upper surface of the thermoelectric cooler with at least the metal layer interposed therebetween, the mounting substrate having a first wiring pattern electrically connected to the photoelectric device;
   a relay substrate having a second wiring pattern electrically connected to the signal lead pin; and
   a signal wire configured to connect the first wiring pattern and the second wiring pattern.

2. The optical module according to claim 1, wherein
   the mounting substrate has a mounting surface on which the photoelectric device is mounted, and
   the upper surface of the thermoelectric cooler and the mounting surface face in respective directions intersecting with each other.

3. The optical module according to claim 2, wherein the photoelectric device is arranged such that an optical axis extends in a direction parallel to the mounting surface.

4. The optical module according to claim 1, further comprising a support block interposed between the metal layer and the mounting substrate.

5. The optical module according to claim 4, wherein the support block has a cuboid shape, the cuboid shape having a surface fixed to the metal layer and another surface fixed to the mounting substrate, which are adjacent to each other.

6. The optical module according to claim 4, wherein the support block is made of metal.

7. The optical module according to claim 4, wherein the support block is made of non-metal.

8. The optical module according to claim 1, wherein
   the metal layer is part of a metal block interposed between the upper surface of the thermoelectric cooler and the mounting substrate,
   the metal block has a projection integral with the metal layer, and
   the mounting substrate is mounted on the projection.

9. The optical module according to claim 1, wherein
the signal lead pin is adapted to single-ended driving of the photoelectric device, and
the first wiring pattern has a ground electrode to which a back side of the photoelectric device is bonded.

10. The optical module according to claim 1, wherein
the signal lead pin is a pair of signal lead pins adapted to drive the photoelectric device by differential signals,
the first wiring pattern includes a pair of first differential signal lines, and
the second wiring pattern includes a pair of second differential signal lines bonded to the respective pair of signal lead pins.

11. The optical module according to claim 1, wherein the ground wire is two or more ground wires.

12. The optical module according to claim 1, wherein
the conductive block has a pedestal portion integral with the first surface, and
the relay board rests on the pedestal portion.

13. The optical module according to claim 1, further comprising a thermistor mounted on the metal layer.

* * * * *